(12) United States Patent
Ho

(10) Patent No.: US 10,121,696 B2
(45) Date of Patent: Nov. 6, 2018

(54) ELECTRONIC DEVICE PACKAGE AND MANUFACTURING METHOD THEREOF

(71) Applicant: Winbond Electronics Corp., Taichung (TW)

(72) Inventor: Yu-Hsuan Ho, Taichung (TW)

(73) Assignee: Winbond Electronics Corp., Taichung (TW)

(*) Notice: Subject to any disclaimer, the term of this patent is extended or adjusted under 35 U.S.C. 154(b) by 24 days.

(21) Appl. No.: 15/298,251

(22) Filed: Oct. 20, 2016

(65) Prior Publication Data

US 2017/0236764 A1   Aug. 17, 2017

(30) Foreign Application Priority Data

Feb. 16, 2016   (CN) .......................... 2016 1 0086675

(51) Int. Cl.
| | | |
|---|---|---|
| *H01L 23/48* | (2006.01) | |
| *H01L 23/52* | (2006.01) | |
| *H01L 29/40* | (2006.01) | |
| *H01L 21/768* | (2006.01) | |
| *H01L 23/498* | (2006.01) | |
| *H01L 21/56* | (2006.01) | |
| *H01L 23/14* | (2006.01) | |
| *H01L 23/15* | (2006.01) | |
| *H01L 23/31* | (2006.01) | |

(52) U.S. Cl.
CPC ........ *H01L 21/76838* (2013.01); *H01L 21/56* (2013.01); *H01L 23/145* (2013.01); *H01L 23/15* (2013.01); *H01L 23/4985* (2013.01); *H01L 23/49844* (2013.01); *H01L 23/3121* (2013.01)

(58) Field of Classification Search
None
See application file for complete search history.

(56) References Cited

U.S. PATENT DOCUMENTS

| | | |
|---|---|---|
| 2003/0089984 A1 | 5/2003 | Kishimoto et al. |
| 2006/0055036 A1 | 3/2006 | Hashimoto |

(Continued)

FOREIGN PATENT DOCUMENTS

| | | |
|---|---|---|
| TW | 507262 | 10/2002 |
| TW | 201037799 | 10/2010 |

(Continued)

OTHER PUBLICATIONS

"Office Action of Taiwan Counterpart Application", dated Nov. 10, 2016, p. 1-p. 5, in which the listed references were cited.

*Primary Examiner* — Calvin Y Choi
(74) *Attorney, Agent, or Firm* — JCIPRNET

(57) ABSTRACT

An electronic device package and a manufacturing method thereof are provided. The electronic device package includes a flexible substrate, a first wiring structure, a first electronic device and a thermoplastic film having a second wiring structure. The first wiring structure is disposed on the flexible substrate. The first electronic device is disposed on the flexible substrate. The first electronic device and the first wiring structure are separated from each other. The thermoplastic film is welded to the flexible substrate and seals the first electronic device. The second wiring structure electrically connects the first wiring structure to the first electronic device. The electronic device package can be manufactured with a production cost.

16 Claims, 2 Drawing Sheets

(56) References Cited

U.S. PATENT DOCUMENTS

| | | | | |
|---|---|---|---|---|
| 2006/0110853 A1* | 5/2006 | Chen | ................ | H01L 21/561 438/110 |
| 2007/0057796 A1* | 3/2007 | Craig | ............ | G06K 19/07749 340/572.7 |
| 2008/0089039 A1* | 4/2008 | Gregory | ............ | B81C 1/00333 361/749 |
| 2013/0210186 A1* | 8/2013 | Hiraike | ............ | B32B 27/304 438/64 |
| 2015/0369681 A1* | 12/2015 | Imai | ............ | G01C 5/06 73/727 |
| 2016/0062520 A1* | 3/2016 | Choi | ............ | H01L 27/3248 345/174 |

FOREIGN PATENT DOCUMENTS

| | | |
|---|---|---|
| TW | 201513296 | 4/2015 |
| TW | 201523811 | 6/2015 |

* cited by examiner

ELECTRONIC DEVICE PACKAGE AND MANUFACTURING METHOD THEREOF

CROSS-REFERENCE TO RELATED APPLICATION

This application claims the priority benefit of China application serial no. 201610086675.1, filed on Feb. 16, 2016. The entirety of the above-mentioned patent application is hereby incorporated by reference herein and made a part of this specification.

BACKGROUND OF THE INVENTION

Field of Invention

The present invention relates to a package and a manufacturing method thereof, and more generally to an electronic device package and a manufacturing method thereof.

Description of Related Art

In the method of forming a conventional electronic device package, multiple processes such as photolithography and etching processes are adopted to define conductive structures or connecting paths, and such process steps are relatively complicated. In addition to the complicated process steps, material waste and high equipment cost are also the main reasons which lead to a high semiconductor production cost in the method of forming a conventional package. Therefore, how to achieve a fast and low-cost package has been drawn high attention and efforts in the industry.

SUMMARY OF THE INVENTION

The present invention provides an electronic device package with a lower production cost.

The present invention further provides a manufacturing method of forming an electronic device package, so as to effectively reduce the process complexity.

The present invention provides an electronic device package includes a flexible substrate, a first wiring structure, a first electronic device and a thermoplastic film having a second wiring structure. The first wiring structure is disposed on the flexible substrate. The first electronic device is disposed on the flexible substrate. The first electronic device and the first wiring structure are separated from each other. The thermoplastic film is welded to the flexible substrate and seals the first electronic device. The second wiring structure electrically connects the first wiring structure to the first electronic device.

The present invention further provides a manufacturing method of forming an electronic device package which includes the following steps. A first wiring structure is formed on a flexible substrate. A first electronic device is placed on the flexible substrate. The first electronic device and the first wiring structure are separated from each other. A thermoplastic film having a second wiring structure is welded to the flexible substrate and seals the first electronic device. The second wiring structure electrically connects the first wiring structure to the first electronic device.

In view of the above, the present invention provides an electronic device package and a manufacturing method thereof, in which a thermoplastic film with a second wiring structure is welded to a flexible substrate and encapsulates a first electronic device. By such manner, the process complexity can be effectively reduced, the process time can be shortened and the production cost can be lowered.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
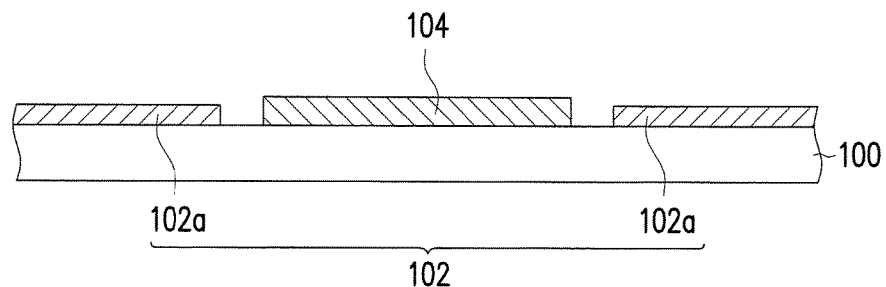
FIG. 1A to FIG. 1C are cross-sectional views of a manufacturing method of an electronic device package according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
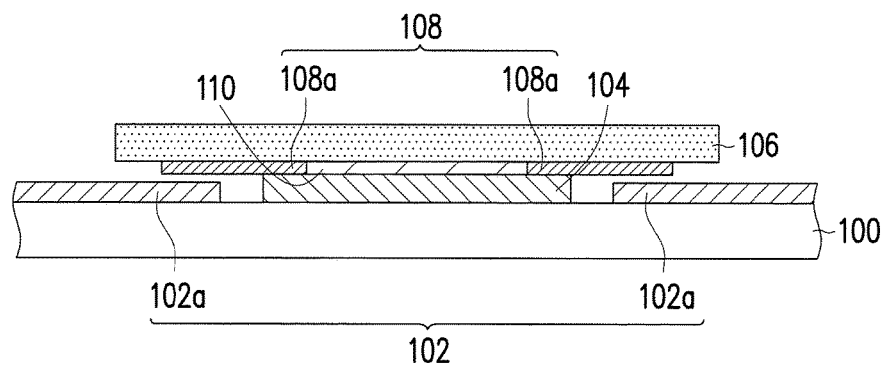
Figure 1C:
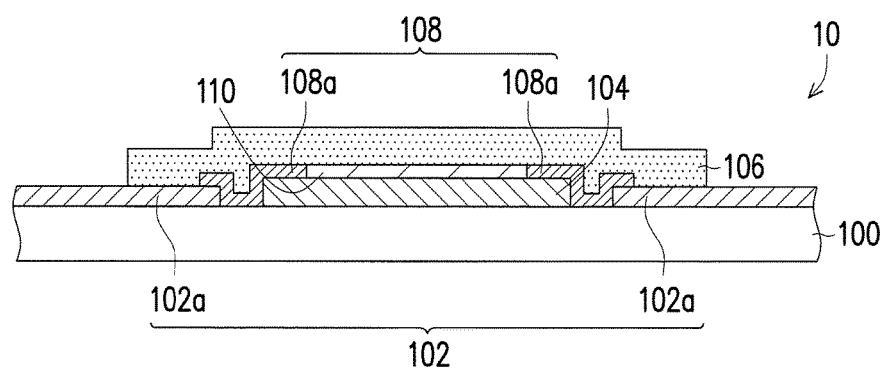
Figure 2:
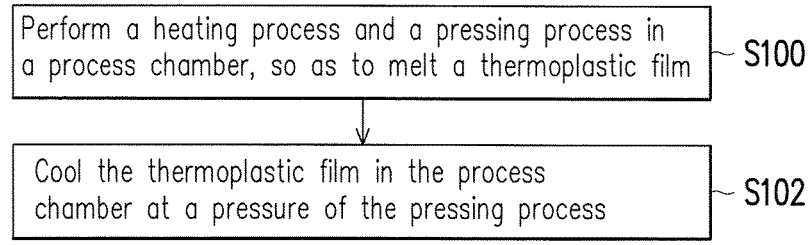
FIG. 2 is a process flow of welding a thermoplastic film to a flexible substrate according to an embodiment of the present invention.
Figure 3:
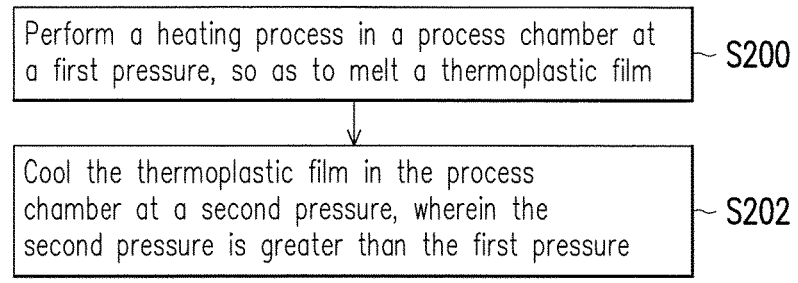
FIG. 3 is a process flow of welding a thermoplastic film to a flexible substrate according to another embodiment of the present invention.

FIG. 1A to FIG. 1C are cross-sectional views of a manufacturing method of an electronic device package according to an embodiment of the present invention. FIG. 2 is a process flow of welding a thermoplastic film to a flexible substrate according to an embodiment of the present invention. FIG. 3 is a process flow of welding a thermoplastic film to a flexible substrate according to another embodiment of the present invention.

Referring to FIG. 1A, a wiring structure 102 is formed on a flexible substrate 100. The material of the flexible substrate 100 includes plastics or glass. The plastics can be polycarbonate (PC), polyethylene terephthalate (PET) or polyethylene naphthalate (PEN).

The wiring structure 102 can include at least one conductive wire 102a. This embodiment in which the wiring structure 102 includes two conductive wires 102a is provided for illustration purposes, and is not construed as limiting the present invention. The material of the wiring structure 102 can be Ag or Cu. The method of forming the wiring structure 102 includes performing a printing or a combination of deposition, photolithography and etching processes. The printing can be a three-dimensional printing, an ink-jet printing, an intaglio printing, a screen printing, a flexography printing or a planographic printing.

An electronic device 104 is placed on the flexible substrate 100. The electronic device 104 and the wiring structure 102 are separated from each other. The electronic device 104 can be an integrated circuit chip.

Besides, the wiring structure 102 and the electronic device 104 can be protruded from the surface of the flexible substrate 100 or recessed in the flexible substrate 100. In this embodiment, the wiring structure 102 and the electronic device 104 are protruded from the surface of the flexible substrate 100, but the present invention is not limited thereto.

Referring to FIG. 1B, a thermoplastic film 106 can be placed on the flexible substrate 100, and a wiring structure 108 is aligned to the wiring structure 102 and the electronic device 104.

Referring to FIG. 1C, the thermoplastic film 106 having the wiring structure 108 is welded to the flexible substrate 100, and seals the electronic device 104. The wiring structure 108 electrically connects the wiring structure 102 to the electronic device 104. In this embodiment, the thermoplastic film 106 with the wiring structure 108 is adopted to encapsulate the electronic device 104, so as to effectively reduce the process complexity, shorten the process time and lower the production cost. The step of welding the thermoplastic film 106 to the flexible substrate 100 can be performed in an environment with relatively low water vapor and oxygen contents, so as to prevent the electronic device 104 from being damaged by the water vapor or oxygen.

The material of the thermoplastic film 106 includes plastics. The plastics can be polycarbonate (PC), polyethylene terephthalate (PET) or polyethylene naphthalate (PEN).

The wiring structure 108 can include at least one conductive wire 108a. This embodiment in which the wiring structure 108 includes two conductive wires 108a is provided for illustration purposes, and is not construed as limiting the present invention. The material of the wiring structure 108 can be Ag or Cu. The method of forming the wiring structure 108 includes performing a printing. The printing can be a three-dimensional printing, an ink-jet printing, an intaglio printing, a screen printing, a flexography printing or a planographic printing. Besides, the printing can be a roll-to-roll printing. A cheap and fast mass production is easily achieved when a roll-to-roll printing is adopted to print the wiring structure 108 to the thermoplastic film 106.

The thermoplastic film 106 can further have an electronic device 110. The electronic device 110 is electrically connected to the wiring structure 108. According to the product design requirements, the electronic device 110 and the electronic device 104 can be arranged to be insulated from each other, so as to avoid an undesired electrical connection. For example, the electronic device 110 is insulated from the electronic device 104 by an insulating material (not shown) at the contact area. In the case that the electronic device 110 and the electronic device 104 are insulated from each other, if needed, the electronic device 110 can be electrically connected to the electronic device 104 through the wiring structure 108. The electronic device 110 can be a radio frequency identification (RFID) device or a thin film transistor (TFT). The method of forming the electronic device 110 includes performing a printing. The printing can be a three-dimensional printing, an ink-jet printing, an intaglio printing, a screen printing, a flexography printing or a planographic printing.

The method of welding the thermoplastic film 106 to the flexible substrate 100 includes performing a heating process to the thermoplastic film 106. The temperature of the heating process can be equal to or greater than the glass transition temperature of the thermoplastic film 106. The temperature of the heating process ranges from 100° C. to 200° C., for example.

Besides, in order to enhance the pore filling capability of the thermoplastic film 106 and therefore to encapsulate the electronic device 104 in a compact manner, the methods described in the embodiments of FIG. 2 or FIG. 3 can be adopted to weld the thermoplastic film 106 to the flexible substrate 100.

Referring to FIG. 2, a step S100 is implemented, in which a heating process and a pressing process are performed in a process chamber, so as to melt the thermoplastic film 106. Therefore, the pore filling capability of the melted thermoplastic film 106 can be enhanced by the high pressure in the process chamber. The temperature of the heating process ranges from 100° C. to 200° C., for example. The pressure of the pressing process ranges from 1 kgw/cm$^2$ to 100 kgw/cm$^2$, for example.

A step S102 is optionally implemented, in which the thermoplastic film 106 is cooled in the process chamber at the pressure of the above pressing process. Therefore, the pore filling capability of the melted thermoplastic film 106 can be continuously enhanced by the high pressure in the process chamber. In this embodiment, the thermoplastic film 106 is cooled to the room temperature, for example.

Referring to FIG. 3, a step S200 is implemented, in which a heating process is performed in a process chamber at a first pressure, so as to melt the thermoplastic film 106. The temperature of the heating process ranges from 100° C. to 200° C., for example. When the heating process is performed at the first pressure, the vacuum degree of the process chamber ranges from 760 torr to $10^{-3}$ torr, for example. The first pressure can be 760 torr to $10^{-3}$ torr, for example.

A step S202 is implemented, in which the thermoplastic film 106 is cooled in the process chamber at a second pressure, wherein the second pressure is greater than the first pressure. Therefore, the pore filling capability of the melted thermoplastic film 106 can be enhanced by the pressure difference between the second pressure and the first pressure. The second pressure can be 760 torr to 1 torr, for example. In this embodiment, the thermoplastic film 106 is cooled to the room temperature, for example.

The electronic device package 10 of this embodiment is illustrated below with reference to FIG. 1C.

Referring to FIG. 1C, an electronic device package 10 includes a flexible substrate 100, a wiring structure 102, an electronic device 104 and a thermoplastic film 106 having a wiring structure 108. The wiring structure 102 is disposed on the flexible substrate 100. The wiring structure 102 can include at least one conductive wire 102a. The electronic device 104 is disposed on the flexible substrate 100. The electronic device 104 and the wiring structure 102 are separated from each other. The thermoplastic film 106 is welded to the flexible substrate 100, and seals the electronic device 104. The wiring structure 108 electrically connects the wiring structure 102 to the electronic device 104. The thermoplastic film 106 can further have an electronic device 110. The electronic device 110 is electrically connected to the wiring structure 108. The wiring structure 108 can include at least one conductive wire 108a. The materials, forming methods and effects of the elements of the electronic device package 10 have been described in the above embodiments, so the details are not iterated herein.

In view of the above embodiments, in the electronic device package 10 and the manufacturing method thereof, the thermoplastic film 106 with the wiring structure 108 is welded to the flexible substrate 100 to encapsulate the electronic device 104, so as to effectively reduce the process complexity, shorten the process time and lower the production cost. Besides, the electronic device package 10 adopts a flexible substrate 100, so it has the potential to be integrated with a flexible electronic device. On the other hand, as compared to the conventional package process, the method of forming the electronic device package 10 causes less pollution to the environment.

Figure 4:
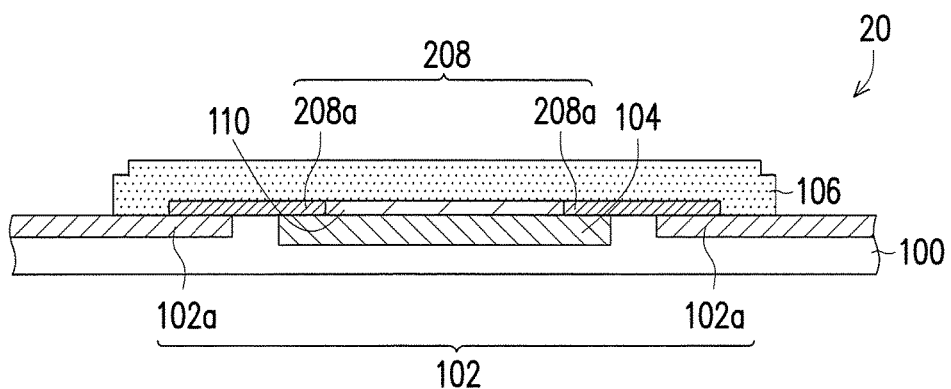
FIG. 4 is a cross-sectional view of an electronic device package according to another embodiment of the present invention.

FIG. 4 is a cross-sectional view of an electronic device package according to another embodiment of the present invention.

Referring to both FIG. 1C and FIG. 4, the difference between the electronic device package 10 and the electronic device package 20 is described in the following. In the electronic device package 10, the electronic device 104 and the wiring structure 102 are protruded from the surface of the flexible substrate 100, so the conductive wires 108a of the wiring structure 108 may be deformed during the step of welding the thermoplastic film 106 having a wiring structure 108 to the flexible substrate 100. In the electronic device package 20, the electronic device 104 and the wiring structure 102 are recessed in the flexible substrate 100, and the top surface of the wiring structure 102, the top surface of the electronic device 104 and the surface of the flexible substrate 100 form a planar surface. Therefore, during the step of welding the thermoplastic film 106 having a wiring structure 208 to the flexible substrate 100, the conductive wires 208a of the wiring structure 208 are free of the undesired deformation and therefore the wiring structure 208 can have a better wire bonding capability.

Specifically, as compared to the process steps of manufacturing the electronic device package 10, the manufacturing method of the electronic device package 20 can further include the following steps. Before the step of welding the thermoplastic film 106 to the flexible substrate 100, a heating process and a pressing process are performed in a process chamber, such that the wiring structure 102 and the electronic device 104 are recessed in the flexible substrate 100, and the top surface of the wiring structure 102, the top surface of the electronic device 104 and the surface of the flexible substrate 100 form a planar surface. The temperature of the heating process can be equal to or more than the glass transition temperature of the flexible substrate 100. The temperature of the heating process ranges from 100° C. to 200° C., for example. The pressure of the pressing process ranges from 1 kgw/cm$^2$ to 100 kgw/cm$^2$, for example.

Besides, the same or similar reference numbers used in the electronic device package 20 of FIG. 4 and in the electronic device package 10 of FIG. 1C represent the same or similar elements. Accordingly, no further description is provided herein.

In summary, in the electronic device packages of the above embodiments and the manufacturing methods thereof, a thermoplastic film with a wiring structure is adopted to encapsulate an electronic device, so as to effectively reduce the process complexity, shorten the process time and lower the production cost.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An electronic device package, comprising:
a flexible substrate;
a first wiring structure, disposed on the flexible substrate;
a first electronic device, disposed on the flexible substrate, wherein the first electronic device and the first wiring structure are separated from each other; and
a thermoplastic film having a second wiring structure, welded to the flexible substrate and sealing the first electronic device, wherein the second wiring structure directly connects the first wiring structure and the first electronic device, and
the thermoplastic film partially covers the first wiring structure.

2. The electronic device package of claim 1, wherein the first electronic device comprises an integrated circuit chip.

3. The electronic device package of claim 1, wherein the first wiring structure and the first electronic device are protruded from a surface of the flexible substrate or recessed in the flexible substrate.

4. The electronic device package of claim 1, wherein the thermoplastic film further has a second electronic device electrically connected to the second wiring structure.

5. The electronic device package of claim 4, wherein the second electronic device comprises a radio frequency identification device or a thin film transistor.

6. A manufacturing method of an electronic device package, comprising:
forming a first wiring structure on a flexible substrate;
placing a first electronic device on the flexible substrate, wherein the first electronic device and the first wiring structure are separated from each other; and
welding a thermoplastic film having a second wiring structure to the flexible substrate, wherein the thermoplastic film seals the first electronic device,
the second wiring structure directly connects the first wiring structure and the first electronic device, and
the thermoplastic film partially covers the first wiring structure.

7. The manufacturing method of claim 6, wherein a method of forming the first wiring structure comprises performing a printing.

8. The manufacturing method of claim 6, further comprising, before the step of welding the thermoplastic film to the flexible substrate, performing a first heating process and a first pressing process in a process chamber, such that the first wiring structure and the first electronic device are recessed in the flexible substrate, and a top surface of the first wiring structure, a top surface of the first electronic device and a surface of the flexible substrate form a planar surface.

9. The manufacturing method of claim 6, further comprising, before the step of welding the thermoplastic film to the flexible substrate, placing the thermoplastic film on the flexible substrate, wherein the second wiring structure is aligned to the first wiring structure and the first electronic device.

10. The manufacturing method of claim 6, wherein a method of forming the second wiring structure comprises performing a printing.

11. The manufacturing method of claim 10, wherein the printing comprises a roll-to-roll printing.

12. The manufacturing method of claim 6, wherein the thermoplastic film further has a second electronic device electrically connected to the second wiring structure.

13. The manufacturing method of claim 6, wherein a method of welding the thermoplastic film to the flexible substrate comprises performing a second heating process to the thermoplastic film.

14. The manufacturing method of claim 13, wherein the method of welding the thermoplastic film to the flexible substrate comprises:

performing the second heating process and a second pressing process in a process chamber, so as to melt the thermoplastic film.

15. The manufacturing method of claim 14, wherein the method of welding the thermoplastic film to the flexible substrate further comprises:
cooling the thermoplastic film in the process chamber at a pressure of the second pressing process.

16. The manufacturing method of claim 13, wherein the method of welding the thermoplastic film to the flexible substrate comprises:
performing the second heating process in a process chamber at a first pressure, so as to melt the thermoplastic film; and
cooling the thermoplastic film in the process chamber at a second pressure, wherein the second pressure is greater than the first pressure.

\* \* \* \* \*